United States Patent
Divakaruni et al.

(10) Patent No.: US 8,017,997 B2
(45) Date of Patent: Sep. 13, 2011

(54) VERTICAL METAL-INSULATOR-METAL (MIM) CAPACITOR USING GATE STACK, GATE SPACER AND CONTACT VIA

(75) Inventors: Ramachandra Divakaruni, Ossining, NY (US); Mukta G. Farooq, Hopewell Junction, NY (US); Jeffrey P. Gambino, Westford, VT (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 12/344,697

(22) Filed: Dec. 29, 2008

(65) Prior Publication Data

US 2010/0163949 A1    Jul. 1, 2010

(51) Int. Cl.
   *H01L 29/76*       (2006.01)
   *H01L 29/94*       (2006.01)

(52) U.S. Cl. ............... 257/346; 257/401; 257/E27.06; 257/E29.165

(58) Field of Classification Search .................. 257/346, 257/401, E27.06, E29.165
See application file for complete search history.

(56) References Cited

U.S. PATENT DOCUMENTS

| | | | | |
|---|---|---|---|---|
| 4,753,897 A * | 6/1988 | Lund et al. | ...................... | 438/296 |
| 6,030,876 A * | 2/2000 | Koike | ............................ | 438/303 |
| 6,228,696 B1 | 5/2001 | Nguyen et al. | | |
| 6,451,667 B1 | 9/2002 | Ning | | |
| 6,589,838 B2 | 7/2003 | Green et al. | | |
| 6,608,747 B1 | 8/2003 | Ito | | |
| 6,696,724 B2 * | 2/2004 | Verhaar | ......................... | 257/314 |
| 6,841,821 B2 | 1/2005 | Hsu | | |
| 6,909,145 B2 | 6/2005 | Cabral, Jr. et al. | | |
| 7,056,785 B2 | 6/2006 | Hsu | | |
| 7,144,783 B2 * | 12/2006 | Datta et al. | ..................... | 438/287 |
| 7,208,371 B2 * | 4/2007 | Jung | .............................. | 438/257 |
| 7,253,481 B2 * | 8/2007 | Wang et al. | ..................... | 257/382 |
| 7,323,379 B2 | 1/2008 | Sinitsky et al. | | |
| 7,528,033 B2 * | 5/2009 | Kim | ................................ | 438/238 |
| 7,670,914 B2 * | 3/2010 | Krivokapic | .................. | 438/300 |
| 7,714,394 B2 * | 5/2010 | Shin et al. | ..................... | 257/375 |
| 2002/0022314 A1 * | 2/2002 | Tuan et al. | ..................... | 438/239 |
| 2004/0038474 A1 | 2/2004 | Clevenger et al. | | |
| 2005/0280095 A1 * | 12/2005 | Nabatame et al. | ............. | 257/369 |
| 2006/0071285 A1 * | 4/2006 | Datta et al. | ..................... | 257/407 |
| 2007/0155153 A1 * | 7/2007 | Okazaki et al. | ............... | 438/597 |
| 2007/0235823 A1 * | 10/2007 | Hsu et al. | ...................... | 257/411 |
| 2008/0006868 A1 | 1/2008 | Hsu et al. | | |
| 2008/0093682 A1 * | 4/2008 | Yao et al. | ....................... | 257/413 |
| 2008/0111180 A1 * | 5/2008 | Choi et al. | ..................... | 257/316 |

(Continued)

*Primary Examiner* — Ngan Ngo

(74) *Attorney, Agent, or Firm* — Scully, Scott, Murphy & Presser, P.C.; Richard M. Kotulak, Esq.

(57) ABSTRACT

A semiconductor structure including a vertical metal-insulator-metal capacitor, and a method for fabricating the semiconductor structure including the vertical metal-insulator-metal capacitor, each use structural components from a dummy metal oxide semiconductor field effect transistor located and formed over an isolation region located over a semiconductor substrate. The dummy metal oxide field effect transistor may be formed simultaneously with a metal oxide semiconductor field effect transistor located over a semiconductor substrate that includes the isolation region. The metal-insulator-metal capacitor uses a gate as a capacitor plate, a uniform thickness gate spacer as a gate dielectric and a contact via as another capacitor plate. The uniform thickness gate spacer may include a conductor layer for enhanced capacitance. A mirrored metal-insulator-metal capacitor structure that uses a single contact via may also be used for enhanced capacitance.

12 Claims, 4 Drawing Sheets

U.S. PATENT DOCUMENTS

| | | | |
|---|---|---|---|
| 2008/0258216 A1* | 10/2008 | Kikuchi | 257/344 |
| 2009/0087956 A1* | 4/2009 | Rao et al. | 438/233 |
| 2009/0087974 A1* | 4/2009 | Waite et al. | 438/592 |
| 2010/0022061 A1* | 1/2010 | Wu et al. | 438/301 |
| 2010/0052018 A1* | 3/2010 | Cohen et al. | 257/288 |
| 2010/0052079 A1* | 3/2010 | Hirano et al. | 257/412 |
| 2010/0059823 A1* | 3/2010 | Chung et al. | 257/355 |
| 2010/0078728 A1* | 4/2010 | Li et al. | 257/369 |
| 2010/0087038 A1* | 4/2010 | Chung et al. | 438/199 |
| 2010/0151669 A1* | 6/2010 | Lindert et al. | 438/589 |

* cited by examiner

VERTICAL METAL-INSULATOR-METAL (MIM) CAPACITOR USING GATE STACK, GATE SPACER AND CONTACT VIA

FIELD OF THE INVENTION

The invention relates generally to metal-insulator-metal (MIM) capacitors, and methods for fabrication thereof. More particularly, the invention relates to metal-insulator-metal capacitors with enhanced manufacturability, and methods for fabrication thereof.

DESCRIPTION OF THE RELATED ART

In addition to transistors, resistors and diodes, microelectronic circuits, such as semiconductor circuits, also include capacitors. In particular within semiconductor circuits, capacitors may be used within applications including but not limited to charge storage applications (i.e., such as but not limited to a charge storage capacitor within a dynamic random access memory (DRAM) cell) and signal processing applications (i.e., such as but not limited to a resistor-capacitor network for microwave signal processing applications).

While capacitors are thus particularly common within semiconductor circuits, capacitors are nonetheless not entirely without problems as semiconductor technology has advanced. In particular, as semiconductor device and semiconductor structure dimensions have decreased, it has become increasingly difficult to form within semiconductor structures capacitors that have increased capacitance within decreasing semiconductor substrate surface area.

Various capacitor structures having desirable properties for use within semiconductor circuits, and methods for fabrication thereof, are known within the semiconductor fabrication art.

Particular examples are taught within: (1) Nguyen et al., in U.S. Pat. No. 6,228,696 (a semiconductor-insulator-semiconductor capacitor that uses the same gate and gate dielectric material as an adjacent metal oxide semiconductor transistor within a semiconductor structure); (2) Ning, in U.S. Pat. No. 6,451,667 (a double sided vertical metal-insulator-metal capacitor that may be fabricated in a self-aligned fashion); (3) Green et al., in U.S. Pat. No. 6,589,838 (a capacitor structure located and formed interposed between gate structures within a semiconductor structure); (4) Ito, in U.S. Pat. No. 6,608,747 (a variable capacitor the uses variable capacitance elements that include gates and source and drain regions); and (5) Hsu, in U.S. Pat. Nos. 6,841,821 and 7,056,785 (a capacitor structure within a non-volatile memory cell that includes an active region sidewall within a shallow isolation trench).

Additional particular examples are also taught within: (6) Cabral Jr., et al., in U.S. Pat. No. 6,909,145 (a metal oxide semiconductor device that includes a capacitor, as well as a metal spacer adjoining a polysilicon gate sidewall); (7) Sinitsky et al., in U.S. Pat. No. 7,323,379 (an embedded dynamic random access memory cell that includes a trench sidewall capacitor); (8) Clevenger et al., in U.S. Pub. No. 2004/0038474 (an integrated metal-insulator-metal capacitor that uses at least in-part the same metallization materials as a metal gate transistor); and (9) Hsu et al., in U.S. Pub. No. 2008/0006868 (a non-volatile memory device that includes a capacitor including a floating gate and a metal plate).

Semiconductor device dimensions and semiconductor structure dimensions are certain to continue to decrease as semiconductor technology advances. To that end, desirable are semiconductor structures, such as but not limited to capacitor structures, that occupy reduced semiconductor substrate area as semiconductor dimensions decrease.

SUMMARY

The invention relates to a semiconductor structure that includes a metal-insulator-metal capacitor structure, and a method for fabricating the semiconductor structure that includes the metal-insulator-metal capacitor structure. The particular metal-insulator-metal capacitor structure within the semiconductor structure includes a vertical metal-insulator-metal capacitor structure that includes as one plate a gate (i.e., a gate material layer) located upon a gate dielectric (i.e., a gate dielectric material layer) in turn located upon an isolation region located over a semiconductor substrate. The metal-insulator-metal capacitor also includes a uniform thickness spacer laterally adjacent (and preferably adjoining) the gate as a capacitor dielectric. The metal-insulator-metal capacitor also includes a contact via (i.e., a contact via material layer) further spaced from the gate and laterally adjacent (and preferably adjoining) the uniform thickness spacer as another plate. A vertical metal-insulator-metal capacitor in accordance with the invention provides value insofar as the vertical metal-insulator-metal capacitor typically requires less semiconductor substrate area than an otherwise equivalent planar metal-insulator-metal capacitor. In addition, the vertical metal-insulator-metal capacitor may be fabricated simultaneously with a metal oxide semiconductor field effect transistor that is fabricated upon an active region of the semiconductor substrate laterally adjacent the isolation region.

A particular semiconductor structure in accordance with the invention includes a dielectric isolation region located over a semiconductor substrate. This particular semiconductor structure also includes a gate dielectric located upon the dielectric isolation region. This particular semiconductor structure also includes a gate located upon the gate dielectric. This particular semiconductor structure also includes a uniform thickness spacer located laterally adjacent a sidewall of the gate. This particular semiconductor structure also includes a contact via located laterally adjacent a sidewall of the uniform thickness spacer.

A particular method for fabricating a semiconductor structure in accordance with the invention includes providing a semiconductor structure including a dielectric isolation region located over a semiconductor substrate. This particular method also includes forming a dummy field effect transistor upon the isolation region, the dummy field effect transistor including: (1) a gate dielectric formed upon the dielectric isolation region; (2) a gate formed upon the gate dielectric; (3) a uniform thickness spacer formed laterally adjacent a sidewall of the gate; and (4) a spacer shaped spacer formed upon the uniform thickness spacer. This particular method also includes removing completely a portion of spacer shaped spacer from the uniform thickness spacer. This particular method also includes forming a contact via upon an exposed portion of the uniform thickness spacer.

BRIEF DESCRIPTION OF THE DRAWINGS

The objects, features and advantages of the invention are understood within the context of the description of the preferred embodiments, as set forth below. The description of the preferred embodiments is understood within the context of the accompanying drawings, that form a material part of this disclosure, wherein.

DESCRIPTION OF THE PREFERRED EMBODIMENTS

The invention, which provides a semiconductor structure including a metal-insulator-metal capacitor, and a method for fabricating the semiconductor structure that includes the metal-insulator-metal capacitor, is understood within the context of the description set forth below. The description set forth below is understood within the context of the drawings described above. Since the drawings are intended for illustrative purposes, the drawings are not necessarily drawn to scale.

Figure 1:
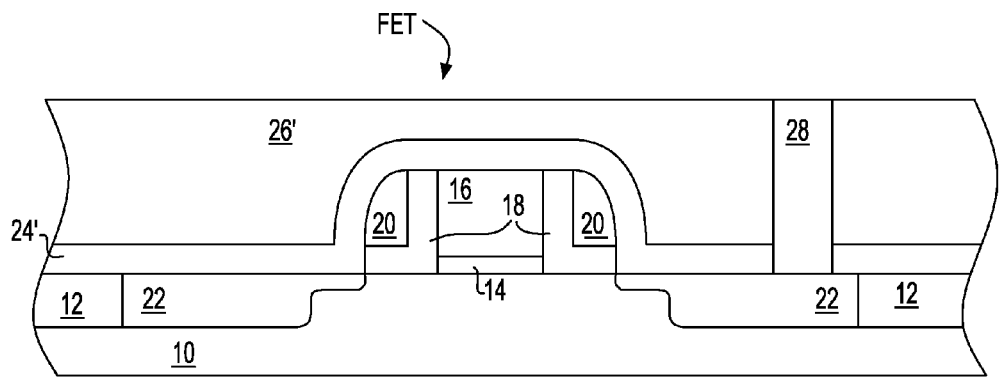
FIG. 1 shows a schematic cross-sectional diagram of a semiconductor structure including a metal oxide semiconductor field effect transistor whose component structures may be used in fabricating a metal-insulator-metal capacitor in accordance with particular embodiments of the invention.

FIG. 1 shows a schematic cross-sectional diagram of a semiconductor structure that includes a metal oxide semiconductor field effect transistor FET generally in accordance with the prior art, where an understanding of the components that comprise the metal oxide semiconductor field effect transistor provides a basis for an understanding of the particular embodiments of the invention which follow.

FIG. 1 first shows a semiconductor substrate 10 that includes an isolation region 12 that laterally bounds an active region of the semiconductor substrate 10.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a generally conventional thickness.

The isolation region 12 may comprise any of several dielectric isolation materials. Non-limiting examples include oxides, nitrides and oxynitrides, particularly of silicon, but oxides, nitrides and oxynitrides of other elements are not excluded. The isolation region 12 may comprise a crystalline or a non-crystalline dielectric material, with non-crystalline dielectrics being highly preferred. The isolation region 12 may be formed using any of several methods. Non-limiting examples include ion implantation methods, thermal or plasma oxidation or nitridation methods, chemical vapor deposition methods and physical vapor deposition methods. Typically, the isolation region 12 comprises an oxide of the semiconductor material from which is comprised the semiconductor substrate 10. Typically, the isolation region 12 comprises a shallow trench isolation region that has a depth within the semiconductor substrate 10 from about 100 to about 1000 nanometers.

Although FIG. 1 illustrates a metal oxide semiconductor field effect transistor within the context of a semiconductor substrate 10 that comprises a bulk semiconductor substrate, exemplary metal oxide semiconductor field effect transistors as predicate structures with respect to embodiments described below may also be fabricated within semiconductor substrates including but not limited to semiconductor-on-insulator substrates and hybrid orientation substrates.

A semiconductor-on-insulator substrate results from locating and forming a buried dielectric layer interposed between a base semiconductor substrate portion and a surface semiconductor layer portion of an otherwise bulk semiconductor substrate, such as the semiconductor substrate 10 that is illustrated in FIG. 1. A hybrid orientation (HOT) substrate typically includes multiple crystallographic orientation semiconductor regions supported within a single semiconductor substrate.

Semiconductor-on-insulator substrates and hybrid orientation substrates may be fabricated using any of several methods. Non-limiting examples include lamination methods, layer transfer methods and separation by implantation of oxygen (SIMOX) methods.

FIG. 1 also shows the metal oxide semiconductor field effect transistor located and formed within and upon the active region of the semiconductor substrate 10. The metal oxide semiconductor field effect transistor comprises: (1) a gate dielectric 14 located and formed upon the active region of the semiconductor substrate 10; (2) a gate 16 located and formed upon the gate dielectric 14; (3) a first spacer 18 having a uniform thickness and an "L" shape located and formed adjacent and adjoining the gate 16 and the gate dielectric 14 sidewalls (i.e., illustrated as plural layers in cross-section, but intended as a single layer encircling the gate 16 and the gate dielectric 14 in plan-view); (4) a spacer shaped second spacer 20 located and formed upon the first spacer 18; and (5) a plurality of source and drain regions 22 located within the active region of the semiconductor substrate 10 and separated by a channel region beneath the gate 16. Each of the foregoing layers and structures may comprise materials and have dimensions that are generally conventional in the semiconductor fabrication art. Each of the foregoing layers and structures may also be formed using methods that are generally conventional in the semiconductor fabrication art.

The gate dielectric 14 may comprise conventional dielectric materials such as oxides, nitrides and oxynitrides of silicon that have a dielectric constant from about 4 to about 20, measured in vacuum. Alternatively, the gate dielectric 14 may comprise generally higher dielectric constant gate dielectric materials having a dielectric constant from about 20 to about 100 (or at least about 100). Such higher dielectric constant gate dielectric materials may include, but are not limited to hafnium oxides, hafnium silicates, titanium oxides, barium-strontium-titantates (BSTs) and lead-zirconate-titanates (PZTs). The gate dielectric 14 may be formed using any of several methods that are appropriate to the material of composition of the gate dielectric 14. Included, but not limiting, are thermal or plasma oxidation or nitridation methods, chemical vapor deposition methods and physical vapor deposition methods. Typically, the gate dielectric 14 comprises a thermal silicon oxide dielectric material that has a thickness from about 1 to about 10 nanometers, or a higher dielectric constant dielectric material, that has a thickness from about 2 to about 10 nanometers.

The gate 16 may comprise materials including, but not limited to certain metals, metal alloys, metal nitrides and metal silicides, as well as laminates thereof and composites thereof. The gate 16 may also comprise doped polysilicon and doped polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate 16 comprises a doped polysilicon material, metal gate material or silicided gate material, that has a thickness from about 100 to about 500 nanometers.

As will be discussed in further detail below, the first spacer 18 will in general comprise at least in-part a dielectric spacer material. Such dielectric spacer materials may be formed using methods analogous, equivalent or identical to the methods that are used for forming the isolation region 12. As indicated above, the first spacer 18 has a uniform thickness (i.e., within about 2 to about 10 percent thickness variation) in a range from about 2 to about 50 nanometers, and the first spacer 18 has an "L" shape that is also intended to include a mirrored "L" shape, where the two portions of the "L" or mirrored "L" are nominally perpendicular.

The second spacer 20 comprises a different spacer material in comparison with the first spacer 18 in order to provide appropriate etch selectivity. Under circumstances where the first spacer 18, for example, comprises a silicon nitride material, the second spacer 20 may, for example, alternatively comprise a silicon oxide material. Such a particular selection of dielectric materials for the first spacer 18 and the second spacer 20 does not, however, limit the instant embodiment or the invention. In particular, the second spacer 20 is also formed with the distinctive inward pointing spacer shape (i.e., including two perpendicular sides bridged by a remaining outwardly curved side) by using a blanket layer deposition and anisotropic etchback method.

Finally, the plurality of source and drain regions 22 comprises a generally conventional dopant. As is understood by a person skilled in the art, the plurality of source and drain regions 22 is formed using a two-step ion implantation method. A first ion implantation process step within the method uses the gate 16, typically absent the first spacer 18 and the second spacer 20, as a mask, to form a plurality of extension regions each of which extends beneath the first spacer 18 and the second spacer 20. A second ion implantation process step uses the gate 18 in conjunction with the first spacer 18 and the second spacer 30 as a mask to form the larger contact region portions of the plurality of source and drain regions 22, while simultaneously incorporating the pair of extension regions. Dopant concentration levels are from about 1e19 to about 1e21 dopant atoms per cubic centimeter within each of the plurality of source and drain regions 22. Extension regions within the plurality of source and drain regions 22 may under certain circumstances be more lightly doped than contact regions with the plurality of source and drain regions 22, although such differential doping concentrations are not a requirement when fabricating a metal oxide semiconductor field effect transistor.

FIG. 1 finally shows a liner layer 24' located and formed upon the semiconductor structure including the metal oxide semiconductor field effect transistor FET. FIG. 1 also shows an inter-level dielectric 26' located and formed upon the liner layer 24'. FIG. 1 finally shows a contact via 28 located and formed through the inter-level dielectric 26' and the liner layer 24' and contacting one of the plurality of source and drain region 22.

Each of the foregoing liner layer 24', inter-level dielectric 26' and contact via 28 may also be formed using methods and materials that area otherwise generally conventional in the semiconductor fabrication art.

The liner layer 24' typically comprises a dielectric liner material. Such a dielectric liner material may possess properties including but not limited to etch stop properties and mechanical stress induction properties, within the semiconductor structure whose schematic cross-sectional diagram is illustrated in FIG. 1. Typically, although not exclusively, such a dielectric liner material will comprise a silicon nitride material that has a thickness from about 10 to about 100 nanometers.

The inter-level dielectric 26' may comprise any of several inter-level dielectric materials. Such dielectric materials desirably include dielectric materials that have an etch selectivity with respect to the liner layer 24'. Suitable dielectric materials include oxides, nitrides and oxynitrides of silicon. Suitable dielectric materials may also include oxides, nitrides and oxynitrides of other elements. Also included, but also not limiting are spin-on-glass materials, spin-on-polymer materials, silsesquioxane dielectric materials and fluorosilicate glass dielectric materials. Any of the particular foregoing dielectric materials may be fabricated using methods that are conventional with respect to that particular dielectric material.

The contact via 28 may in general comprise any of the several above enumerated conductor materials from which may be comprised the gate 16. In accordance with disclosure above, such suitable conductor materials include, but are not necessarily limited to certain metals, metal alloys, metal silicides, metal nitrides, doped polysilicon and polycide conductor materials. Particular conductor materials from which may be comprised the contact via 28 include, but are not limited to tungsten, titanium and tantalum metals, alloys thereof, nitrides thereof and silicides thereof.

As is understood by a person skilled in the art, the semiconductor structure of FIG. 1 is typically fabricated by patterning the gate 16 and gate dielectric 14 upon the active region of the semiconductor substrate 10 while using corresponding blanket gate and gate dielectric material layers. A conformal precursor layer for the first spacer 18 and a related blanket layer for the second spacer 20 are then layered upon the gate 16 and gate dielectric 14, and subsequently anisotropically etched to provide the first spacer 18 and the second spacer 20. The source and drain regions 22 are coincidentally fabricated before and after forming the first spacer 18 and the second spacer 20. The liner layer 24' and the inter-level dielectric 26' are the formed incident to appropriate blanket layer formation and patterning, while using an appropriate etch mask that is not otherwise illustrated. Finally, the contact via 28 is formed using a blanket layer deposition and planarizing method, which may include, but is not limited to a mechanical planarizing method, or more preferably a chemical mechanical polish planarizing method.

The embodiments of the invention in accordance with disclosure below are intended to utilize the basic structural components of the metal oxide semiconductor field effect transistor FET within the semiconductor structure of FIG. 1 to provide, rather that the metal oxide semiconductor field effect transistor FET whose schematic cross-sectional diagram is illustrated in FIG. 1, a particular metal-insulator-metal capacitor structure. To that end, FIG. 2 to FIG. 6 show a series of schematic cross-sectional diagrams illustrating the results of progressive stages in fabricating a metal-insulator-metal capacitor structure within a semiconductor structure in accordance with a particular embodiment of the invention. This particular embodiment of the invention comprises a first particular embodiment of the invention.

Figure 2:
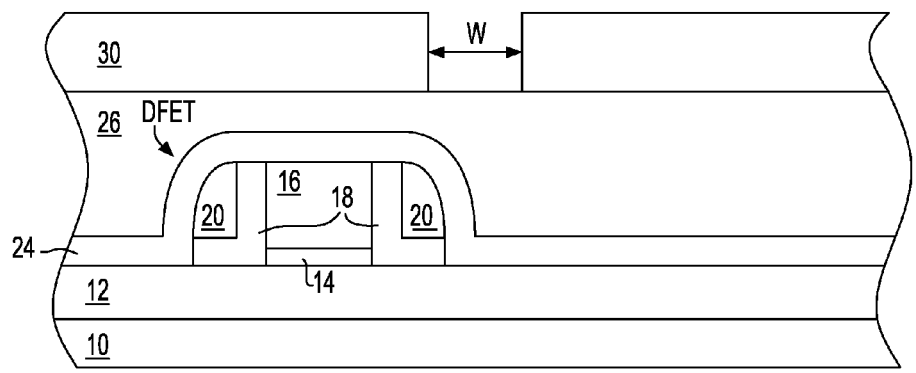
FIG. 2 to FIG. 6 show a series of schematic cross-sectional diagrams illustrating the results of successive layering, selective etching and contact via backfilling process steps in fabricating a semiconductor structure including a metal-insulator-metal capacitor structure in accordance with a particular embodiment of the invention.

FIG. 2 shows the basic semiconductor structure of FIG. 1, but in a first instance absent the source and drain regions 22, insofar as a dummy field effect transistor DFET within the semiconductor structure of FIG. 2 is located and formed completely upon the isolation region 12 (i.e., neither the gate dielectric 14 nor the gate 16 is located upon or aligned above a semiconductor channel region) rather than upon a portion of the semiconductor substrate 10 that includes an active region as is illustrated in FIG. 1.

Also absent within FIG. 2 is the contact via 28 that is illustrated in FIG. 1, and due to the absence of the contact via 28, the liner layer 24' that is illustrated in FIG. 1 is present as a liner layer 24 and the inter-level dielectric 26' that is illustrated in FIG. 1 is present as an inter-level dielectric 26.

Otherwise, like, analogous or identical layers and structures that are illustrated in FIG. 1 and FIG. 2 are designated identically.

Finally, FIG. 2 illustrates a mask 30 located and formed upon the inter-level dielectric 26 and including an aperture at a location at least in-part over the second spacer 20 over one side of the gate 16 but not the other side of the gate 16. As is illustrated within the schematic cross-sectional diagram of FIG. 2, the aperture has a linewidth W from about 50 to about 500 nanometers.

The mask 30 may comprise any of several mask materials. Included in general are hard mask materials and photoresist mask materials, as well as composites of hard mask materials and photoresist mask materials. Photoresist mask materials are generally more common and may include, but are not necessarily limited to positive photoresist materials, negative photoresist materials and hybrid photoresist materials that possess properties of positive photoresist materials and negative photoresist materials. Typically, the mask 30 comprises a positive photoresist material or a negative photoresist material that has a thickness from about 100 to about 2000 nanometers.

Figure 3:
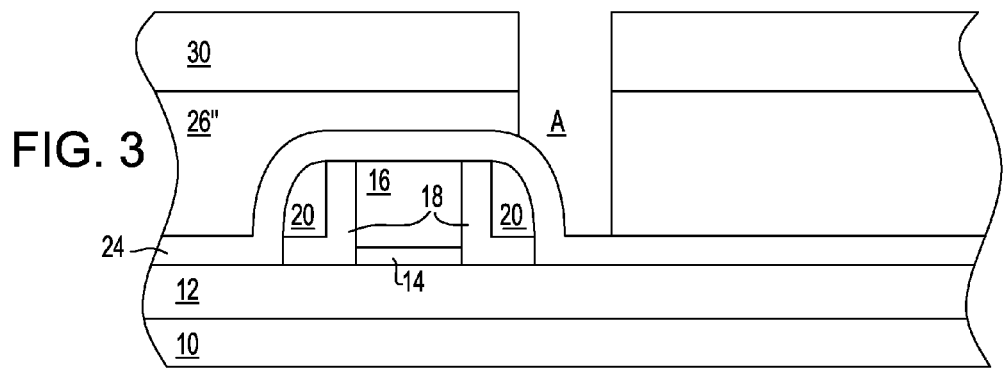

FIG. 3 shows the results of etching the inter-level dielectric 26 to provide an inter-level dielectric 26" defining an aperture A, while using the mask 30 as an etch mask and the liner layer 24 as an etch stop. The inter-level dielectric 26 may be etched to form the inter-level dielectric 26" while using the mask 30 as an etch mask and the liner layer 24 as an etch stop while using etch methods that are also generally conventional in the semiconductor fabrication art. Included in particular, but also not limiting, are wet chemical etch methods and dry plasma etch methods. Dry plasma etch methods are generally preferred insofar as dry plasma etch methods allow for straighter sidewalls for the inter-level dielectric 26".

Figure 4:
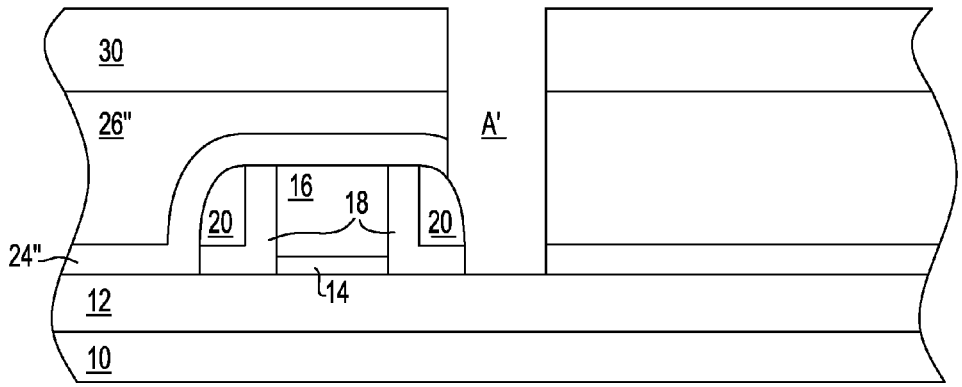

FIG. 4 shows the results of etching the liner layer 24 to form the liner layer 24" while using at least the inter-level dielectric 26', and generally also the mask 30, as an etch mask. The foregoing etching provides an elongated aperture A' from the aperture A, while exposing portions of the second spacer 20 and the isolation region 12 that are now used as etch stops. Similarly with the foregoing etching of the inter-level dielectric 26 to form the inter-level dielectric 26", etching of the liner layer 24 to form the liner layer 24" may also be effected using etch methods and etch materials that are otherwise generally conventional in the semiconductor fabrication art. Included in particular, but also not limiting, are wet chemical etch methods and materials, and dry plasma etch methods and materials. Dry plasma etch methods and materials may again be preferred insofar as dry plasma etch methods and materials provide generally straight sidewalls to etched structures within semiconductor structures.

Figure 5:
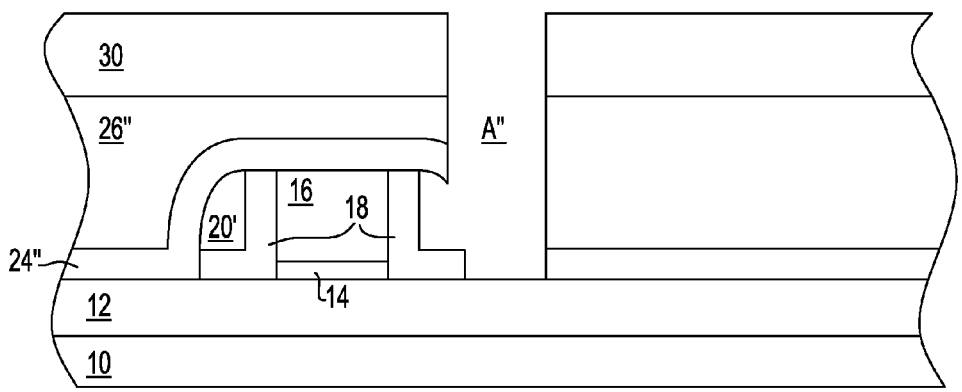

FIG. 5 shows the results of selectively removing a portion of the second spacer 20 from the one side of the gate 16 that is closer to the aperture A' that is illustrated in FIG. 4 to form an aperture A" from the aperture A'. As a result of such etching, a second spacer 20' remains adjoining the first spacer 18 at a side of the gate 16 opposite the aperture A". The foregoing portion of the second spacer 20 may be etched to provide the second spacer 20' while using etch methods and materials that are otherwise generally conventional in the semiconductor fabrication art. Included in particular are wet chemical etch methods and dry plasma etch methods that are intended to be isotropic etch methods that provide the requisite lateral etching that is needed within the context of FIG. 5 to provide the aperture A" that is now both vertically and laterally elongated in comparison with the aperture A that is illustrated in FIG. 3.

Figure 6:
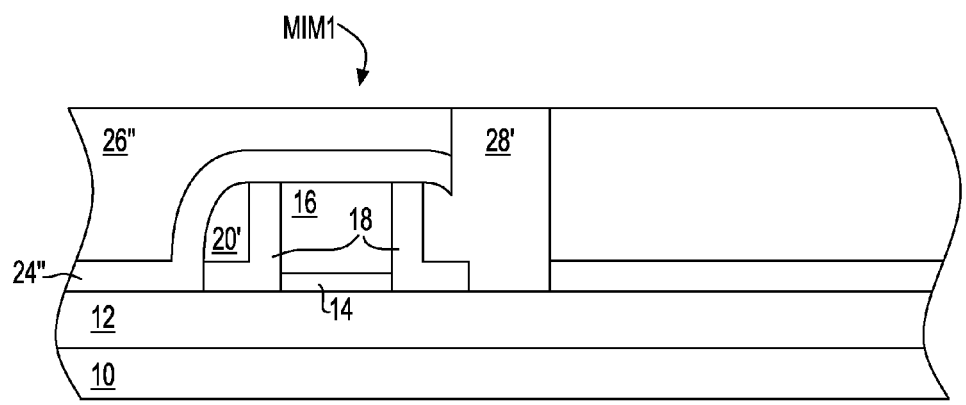

FIG. 6 first shows the results of stripping the mask 30 from the semiconductor structure of FIG. 5. The mask 30 may be stripped from the semiconductor structure of FIG. 5 to provide in-part the semiconductor structure of FIG. 6 while using methods and materials that are otherwise generally conventional in the semiconductor fabrication art. Included in particular, but also not limiting, are wet chemical etch methods, dry plasma etch methods and combinations of wet chemical etch methods and dry plasma etch methods.

FIG. 6 finally shows a contact via 28' located and formed into the aperture A" that is illustrated in FIG. 5. Similarly with the contact via 28 that is illustrated in FIG. 1, the contact via 28' that is illustrated in FIG. 6 may be formed using a blanket layer deposition and planarizing method, such as in particular a chemical mechanical polish planarizing method.

FIG. 6 shows a schematic cross-sectional diagram of a semiconductor structure in accordance with a particular embodiment of the invention that comprises a first embodiment of the invention. The semiconductor structure includes a vertical metal-insulator-metal capacitor. Within the vertical metal-insulator-metal capacitor, a gate 16 (i.e., a gate material layer) (located upon a gate dielectric 14 that in turn is located upon an isolation region 12 in turn located upon a semiconductor substrate 10) comprises a capacitor plate. Within the vertical metal-insulator-metal capacitor a first spacer 18 having a uniform thickness and located laterally adjacent and adjoining the gate 16 comprises a capacitor dielectric. Finally, within the vertical metal-insulator-metal capacitor a contact via 28' located laterally adjacent and adjoining the first spacer 18 comprises another capacitor plate.

The vertical metal-insulator-metal capacitor in accordance with the foregoing embodiment provides value insofar as the vertical metal-insulator-metal capacitor may occupy a minimal amount of projected semiconductor substrate 10 area within the context of vertical scaling of the vertical metal-insulator-metal capacitor. The vertical metal-insulator-metal capacitor provides additional value insofar as the vertical metal-insulator-metal capacitor may be fabricated simultaneously with a metal oxide semiconductor field effect transistor over a single semiconductor substrate.

Figure 7A:
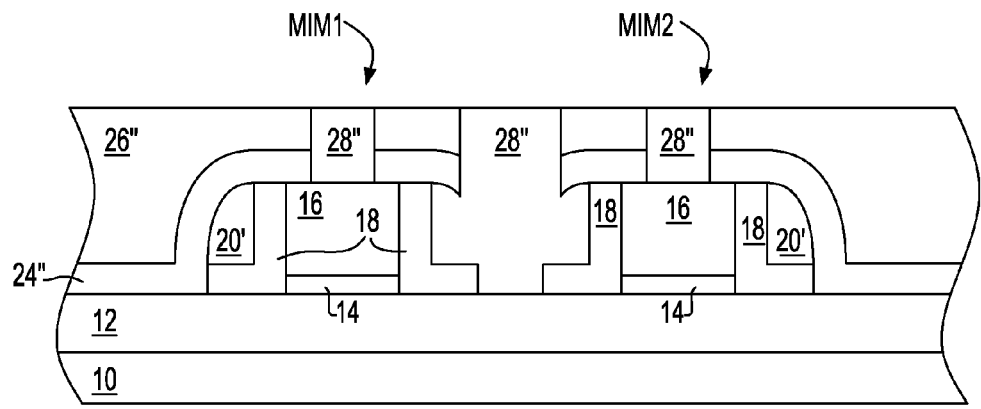
FIG. 7A and FIG. 7B show a schematic cross-sectional diagram and a schematic plan-view diagram of a semiconductor structure including a metal-insulator-metal capacitor related to the metal-insulator-metal capacitor of the particular embodiment of the invention whose schematic cross-sectional diagram is illustrated inn FIG. 6.
Figure 7B:
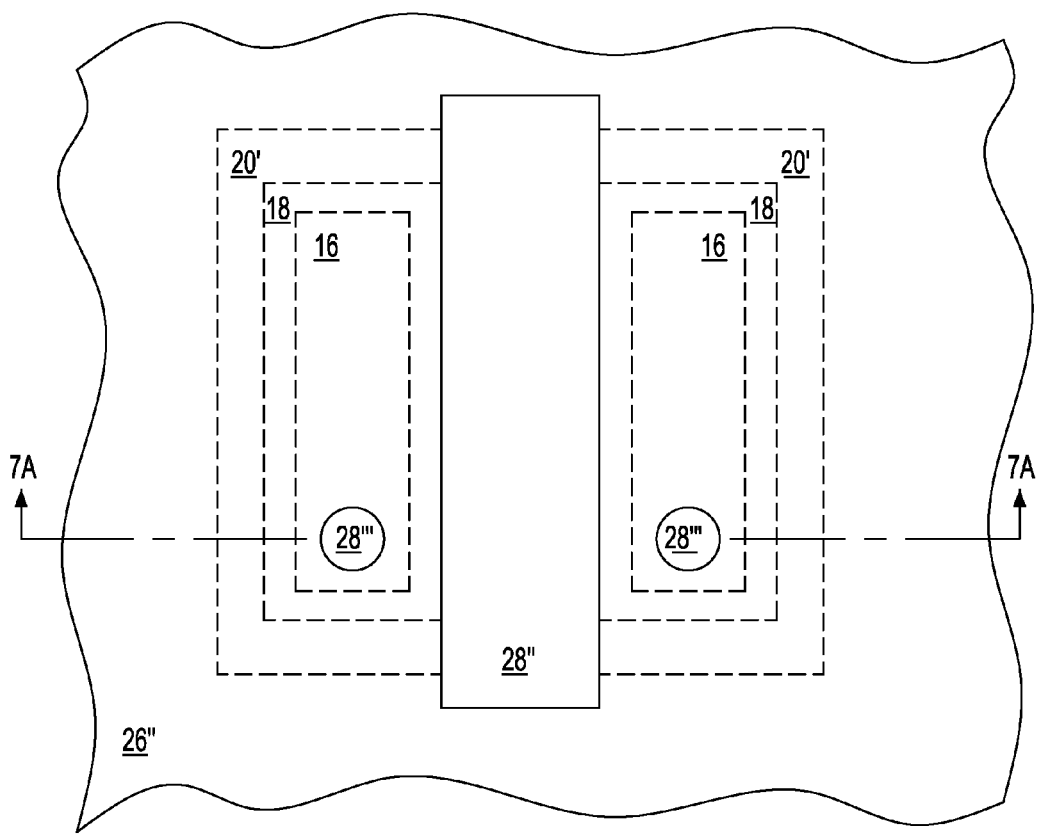

FIG. 7A and FIG. 7B show a schematic cross-sectional diagram and a schematic plan-view diagram of a semiconductor structure related to the semiconductor structure whose schematic cross-sectional diagram is illustrated in FIG. 6.

FIG. 7A shows a schematic cross-sectional diagram of a semiconductor structure that corresponds generally with the semiconductor structure whose schematic cross-sectional diagram is illustrated in FIG. 6, but in addition to a first metal-insulator-metal capacitor MIM1 as illustrated in FIG. 6, FIG. 7A illustrates a second metal-insulator-metal capacitor MIM2 that minors the first metal-insulator-metal capacitor MIM1. The processing sequence for fabricating the semiconductor structure of FIG. 7A is analogous to the processing sequence for fabricating the semiconductor structure of FIG. 6, but with the exception that one first starts with two separated dummy metal oxide semiconductor field effect transistors DFETs rather than a single isolated dummy metal oxide semiconductor field effect transistor DFET that is illustrated in FIG. 2.

The schematic plan-view diagram of FIG. 7B illustrates the gates 16, the first spacers 18 located and formed completely surrounding the gates 16 and the second spacers 20 located and formed partially surrounding the first spacers 18. FIG. 7B finally illustrates the contact vias 28" and 28''' that penetrate through the inter-level dielectric 26" rather than being located beneath the inter-level dielectric 26", as are the other remaining structures that are illustrated in FIG. 7B. Within FIG. 7B, the liner layer 24" is omitted for clarity.

The plurality of metal-insulator-metal capacitors MIM1 and MIM2 that is illustrated in FIG. 7A and FIG. 7B possesses all of the advantages of the single metal-insulator-metal capacitor MIM1 that is illustrated in FIG. 6, but clearly with the presence of additional capacitance.

Figure 8A:
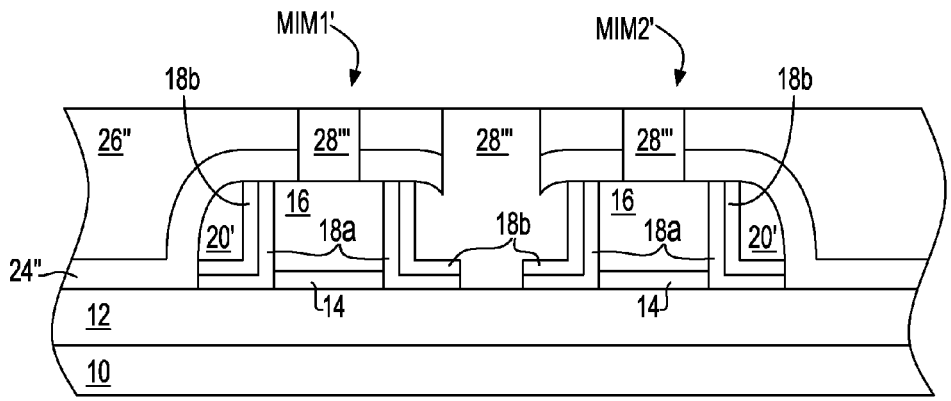
FIG. 8A and FIG. 8B show a schematic cross-sectional diagram and a schematic plan-view diagram of a semiconductor structure including a metal-insulator-metal capacitor in accordance with another particular embodiment of the invention.
Figure 8B:
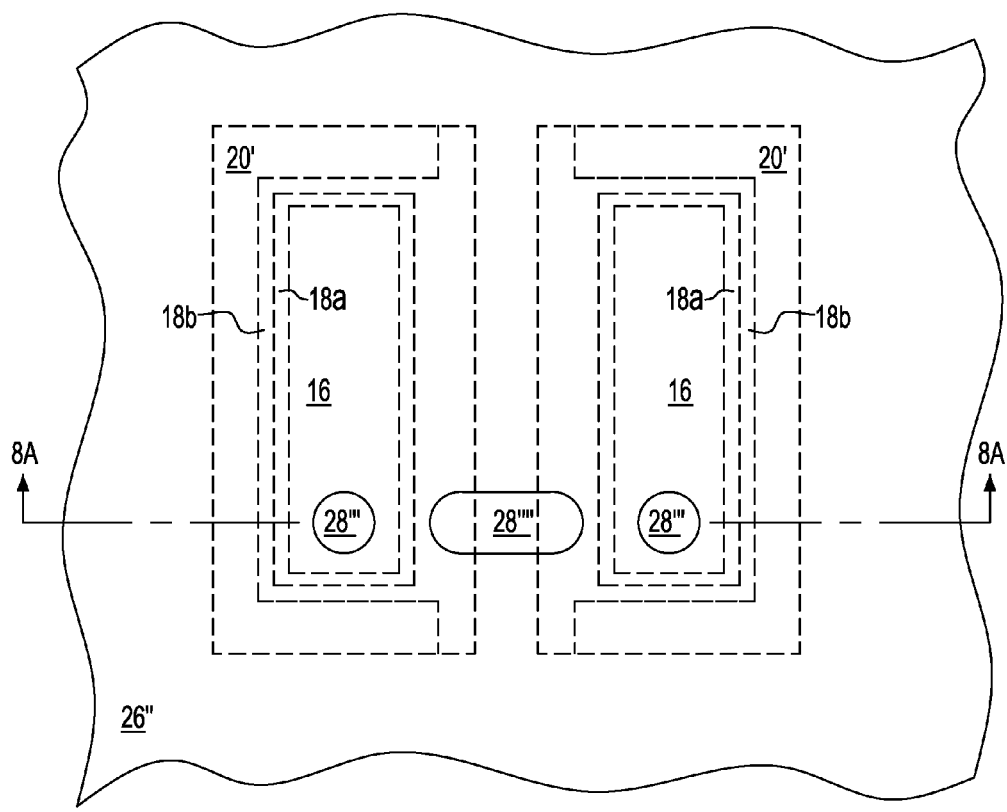

FIG. 8A and FIG. 8B show a schematic cross-sectional diagram and a schematic plan-view diagram of a semiconductor structure in accordance with another embodiment of the invention. This other embodiment of the invention comprises a second embodiment of the invention. This particular semiconductor structure in accordance with this particular second embodiment of the invention is related to the first embodiment of the invention that is illustrated within the schematic cross-sectional and plan-view diagrams of FIG. 7A, FIG. 7B or FIG. 6. However, within the schematic cross-sectional and plan-view diagrams of FIG. 8A and FIG. 8B, the first spacer 18 that is illustrated in FIG. 7A, FIG. 7B and FIG. 6 now comprises a first sub-layer 18a located and formed closer to the gate 16 and a second sub-layer 18b located and formed thereupon and spaced further from the gate 16.

Intended within this second embodiment is that the first sub-layer 18a, which has a thickness from about 2 to about 50 nanometers, comprises a dielectric material, such as but not limited to the dielectric materials from which may be comprised the first spacer 18 that is illustrated in FIG. 6, FIG. 7A and FIG. 7B. Also intended within this second embodiment is that the second sub-layer 18b, which has a thickness from about 5 to about 100 nanometers, comprises a conductor material. Such a conductor material may generally be formed of the same conductor materials from which may be comprised the gates 16.

Within this second embodiment, the second sub-layer 18b that comprises the conductor material may be formed originally as a conductor material, or alternatively as a result of additional in-situ processing of a non-conductive material. Such additional in-situ processing of the non-conductive material may, for example include, but is not necessarily limited to, salicide processing, where for example and without limitation a second sub-layer 18b comprising a non-conductive silicon material may be salicide processed to provide a conductive silicide material for the second sub-layer 18b. Whether the second sub-layer 18b which comprises the conductor material is originally formed of the conductive material or alternatively in-situ formed of the conductor material, it may be desirable to remove portions of the conductive material from a simultaneously formed field effect transistor, such as the field effect transistor FET whose schematic cross-sectional diagram is illustrated in FIG. 1.

Beyond the advantages recited above within the context of the first embodiment, the semiconductor structure whose schematic cross-sectional and plan-view diagrams are illustrated in FIG. 8A and FIG. 8B provide value insofar as the conductive second sub-spacer 18b provides for a greater capacitance contact area, and thus also higher capacitance.

The preferred embodiments of the invention are illustrative of the invention rather than limiting of the invention. Revisions and modifications may be made to methods, materials, structures and dimensions of a semiconductor structure including a metal-insulator-metal capacitor in accordance with the preferred embodiments, while still providing a metal-insulator-metal capacitor and a method for fabrication thereof in accordance with the invention, further in accordance with the accompanying claims.

What is claimed is:

1. A semiconductor structure comprising:
   a dielectric isolation region located on an upper surface of a semiconductor substrate, wherein the dielectric isolation region is a dielectric material selected from the group consisting of silicon oxide, silicon nitride, silicon oxynitride and a combination thereof;
   a gate dielectric located upon the dielectric isolation region;
   a gate located upon the gate dielectric;
   a uniform thickness spacer located laterally adjacent and in direct contact with a sidewall of the gate;
   a contact via located laterally adjacent a sidewall of the uniform thickness spacer on one side of the gate; and
   a second spacer located laterally adjacent a sidewall of the uniform thickness spacer on another side of the gate, where said second spacer is absent from the side of the gate including the contact via.

2. The semiconductor structure of claim 1 wherein the uniform thickness spacer contacts the dielectric isolation region.

3. The semiconductor structure of claim 1 wherein the contact via contacts the dielectric isolation region.

4. The semiconductor structure of claim 1 wherein:
   the gate dielectric is located solely upon the dielectric isolation region; and
   the gate is located aligned upon the gate dielectric.

5. The semiconductor structure of claim 1 wherein:
   the uniform thickness spacer is located laterally adjoining the sidewall of the gate; and
   the contact via is located laterally adjoining the sidewall of the uniform thickness spacer.

6. The semiconductor structure of claim 1 wherein the uniform thickness spacer consists of a dielectric material.

7. The semiconductor structure of claim 1 wherein the uniform thickness spacer comprises a dielectric material sub-layer located closer to the gate and a conductor material sub-layer located further from the gate.

8. The semiconductor structure of claim 7 wherein the dielectric material sub-layer has a thickness from about 2 to about 50 nanometers.

9. The semiconductor structure of claim 7 wherein the conductor material sub-layer has a thickness from about 5 to about 100 nanometers.

10. The semiconductor structure of claim 1 further comprising:
    an additional uniform thickness spacer also located laterally adjacent the contact via and separated from the uniform thickness spacer; and an additional gate located laterally adjacent the additional uniform thickness spacer and separated from the contact via.

11. The semiconductor structure of claim 1, wherein the dielectric isolation region is silicon oxide.

12. The semiconductor structure of claim 1, wherein the dielectric isolation region is silicon nitride.

* * * * *